United States Patent [19]
Milliquet

[11] 3,986,135
[45] Oct. 12, 1976

[54] ANODE ARRANGEMENT FOR THE OUTPUT POWER AMPLIFIER OF A SHORT-WAVE TRANSMITTER

[75] Inventor: Vladimir Milliquet, Wettingen, Switzerland

[73] Assignee: BBC Brown Boveri & Company Limited, Baden, Switzerland

[22] Filed: May 22, 1975

[21] Appl. No.: 579,878

[30] Foreign Application Priority Data
May 28, 1974 Switzerland.......................... 7287/74

[52] U.S. Cl. ............................................... 330/56
[51] Int. Cl.² .......................................... H03F 3/60
[58] Field of Search ................. 330/53, 56; 331/97, 331/98, 101

[56] References Cited
UNITED STATES PATENTS
3,536,952  10/1970  Findley ............................ 331/97 X Primary Examiner—James B. Mullins
Attorney, Agent, or Firm—Toren, McGeady and Stanger

[57] ABSTRACT

An asymmetrical anode arrangement is disclosed for the final stage of a short-wave transmitter of the can type. A transmitting tube is disposed coaxially within a cylindrical housing. A first hollow cylindrical conductor having an opening at the top is mounted to surround the tube and be coaxial therewith. A second thinner cylindrical conductor is disposed outside and adjacent to the first conductor and parallel to the tube axis. A first slide, having openings for the first and second conductors, is mounted within the housing for connecting the housing wall to the first and second conductors. A second slide connects the second conductor to a collector mounted within the housing. Anode voltage is supplied by way of a conductor disposed within the second conductor. A vapor exhaust duct may be coupled to the tube through appropriate concentric openings in the housing, first slide and first conductor.

10 Claims, 3 Drawing Figures

ANODE ARRANGEMENT FOR THE OUTPUT POWER AMPLIFIER OF A SHORT-WAVE TRANSMITTER

BACKGROUND OF THE INVENTION

The present invention relates to an anode circuit for the final stage of a short-wave transmitter in a coaxial line system wherein a first conductor and a wall of the housing are arranged coxially to the transmitting tube.

In short-wave transmitters for the frequency range between 3 and 30 MHz, the output amplifier incorporates a power tube which has an anode circuit of special configuration. The anode circuit, from which the energy is coupled by way of an inductive matching unit, is provided with tuning elements. In general, the anode circuit consists of a discrete variable inductance and a discrete variable capacitance. A further variable inductance connected in series is provided for matching the tube to the load and to couple the energy from the anode circuit. A variable anode inductance in the form of a coil has the disadvantage that it gives rise to spurious resonances originating from its active and its passive parts. If such resonances coincide with harmonics of the transmitting frequency, they can lead to flashovers, cause damage to high-frequency contacts or lower the efficiency of the transmitter. In VHF technology, therefore, a known procedure consists of shifting this spurious resonance to much higher frequency ranges and greatly reducing the coupling between active and passive parts of the inductance by using coaxially arranged anode circuits in which the load is coupled directly to the inner conductor. Transferring this concept to short-wave transmitters, however, would result in the anode circuit being unacceptably tall. Accordingly, this technique though established for VHF, has hitherto not been applied to short-wave transmitters.

SUMMARY OF THE INVENTION

A principal object of the present invention is to create an anode arrangement and circuit employing the coaxial-line principle and of such a form that it can be used not only in the upper portion of the short-wave band, but also at lower frequencies of the short-wave range, yet does not exceed the structural height customary for short-wave transmitters.

This principal object is achieved in that a second conductor next to the first conductor is arranged in the housing parallel to the axis of the coaxial system, and that a first slide bridge is connected between the first conductor and the housing wall and between the second conductor and the housing, and a second slide bridge is connected between the second conductor and an output collector arranged parallel to the second conductor. In this way, it is not only possible to create an anode circuit of high quality which can be tuned over the whole short-wave range and whose height does not exceed typical heights for transmitting stations of this kind, but also the transmitting tube is more easily accessible so that it can be replaced much more simply and quickly than in the past. Furthermore, as a result of this structural arrangement, it is particularly simple, in the case of vapor-cooled tubes, to fit the vapor extraction duct directly above the tube, which results in a particularly simple and effective cooling circuit.

In accordance with an embodiment of the present invention, an anode arrangement for the final stage of a short-wave transmitter of the can type comprises a transmitting tube having a central axis, a housing having a wall surrounding and coaxial with the transmitting tube axis and a second conductor being arranged adjacent to said first conductor within the housing parallel to the transmitting tube axis. Also included is a first slide having portions extending between and connecting the first conductor and the housing wall and the second conductor and the housing wall. An output collector which is arranged within the housing parallel to the second conductor is also included. A second slide is connected between the second conductor and the output collector for providing an output connection for the anode arrangement. An anode voltage supply line is preferably disposed with the second conductor and a vapor exhaust duct may be disposed over the tube through openings in the housing and first slide.

For a better understanding of the present invention, together with other and further objects thereof, reference is made to the drawings and following description while the scope of the invention will be pointed out in the appended claims.

DESCRIPTION OF THE INVENTION

Figure 1:
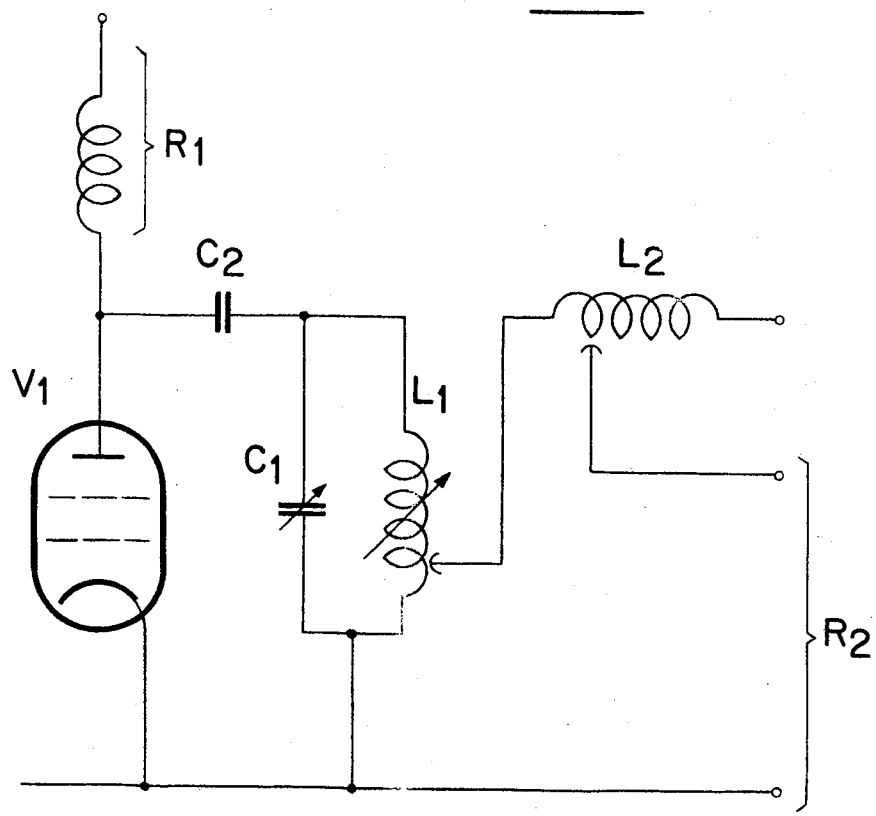
FIG. 1 illustrates the basic equivalent circuit diagram of an anode circuit in accordance with the present state of the technology.

In an equivalent circuit diagram of an anode circuit as shown in FIG. 1, the anode of a transmitting tube $V_1$ is connected via a decoupling capacitor $C_2$ to a parallel resonant circuit comprising a variable capacitor $C_1$ and a variable inductance $L_1$. The low end of the parallel resonant circuit and the cathode of the transmitting tube $V_1$ are commonly grounded. The variable inductance $L_1$ has a slide to which a coupling inductance $L_2$ is connected.

The output of the anode circuit is formed by a slide or moving tap of the coupling inductance $L_2$. The purpose of the coupling inductance is to match the output resistance $R_2$ of the anode circuit to the anode resistance $R_1$ of the transmitting tube.

Figure 2:
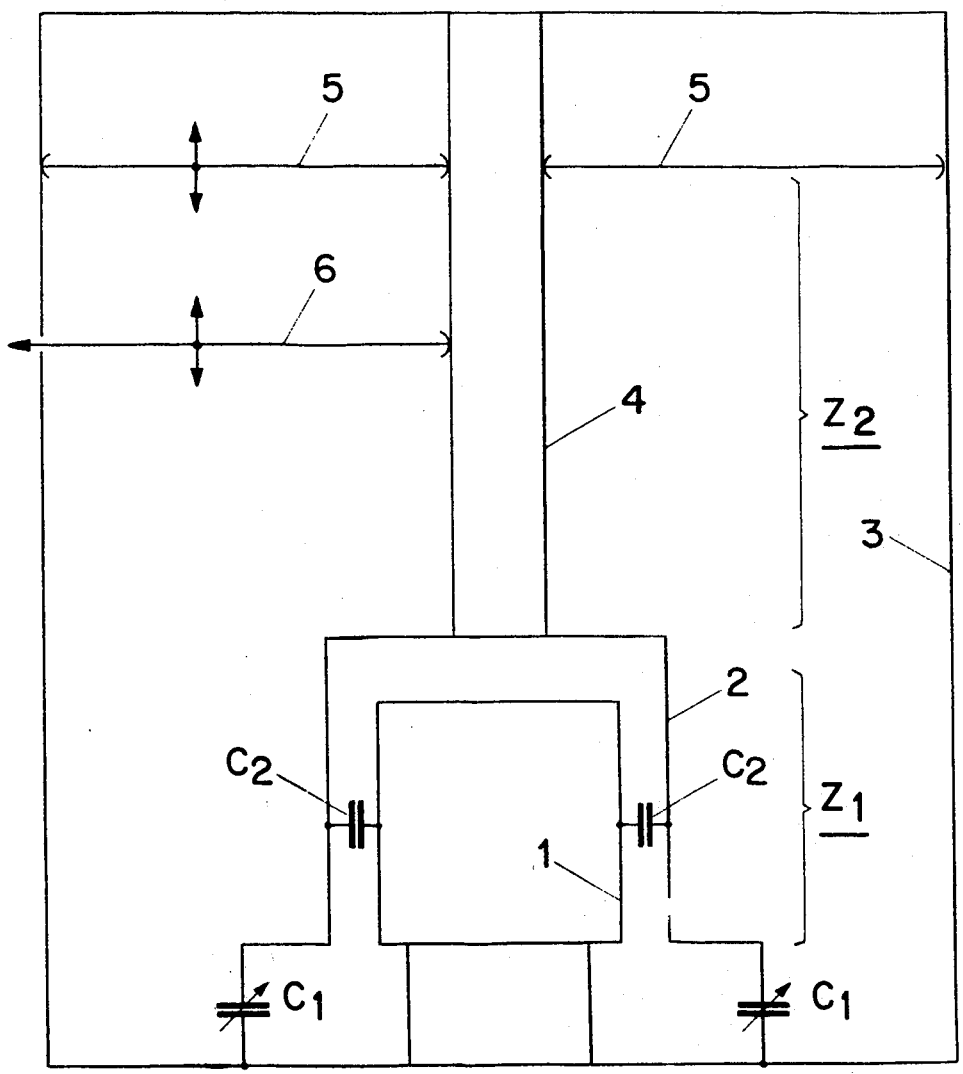
FIG. 2 illustrates the schematic section through a coaxial-line circuit in accordance with the present state of the technology.

In the known configuration of an anode circuit, as shown in FIG. 2, the anode of the tube 1 is surrounded by a cylinder 2 which in direct-current terms is at ground potential. The cylinder 2 and the housing 3 together form a coaxial conductor with a characteristic impedance $Z_1$. Above the tube 1, the cylinder 2 connects to a much thinner cylinder 4 which, together with the housing 3, forms a coaxial conductor with a characteristic impedance $Z_2$. The characteristic impedance $Z_2$ can be considerably higher than the characteristic impedance $Z_1$. In this way, the structural height of the stage can be appreciably smaller. Conductor 4 is terminated by a slide bridge 5. A second slide 6 on the thinner cylindrical portion constitutes the output connections of the anode circuit as indicated in FIG. 1. The capacitors $C_1$ form the tuning capacitors of the resonant circuit, while the isolating capacitor $C_2$ of FIG. 1 is located between the surfaces of the anode of the transmitting tube 1 and the cylindrical surface 2. The opening formed by the cylinder wall 4 above the transmitting tube 1 serves to accommodate a vapor exhaust duct, if this is necessary for cooling the transmitting tube. If the tube 1 has to be replaced, the whole assembly above the tube 1 has to be removed in order to lift out the tube. This is not only time-consuming, but also complicated.

With high-power transmitters, the transmitting tube is correspondingly larger, and consequently cylinder 2 is taller. It is then no longer possible to tune the anode to the highest frequencies of the VHF band because the minimum value of the anode saturation inductance of $L_1$ is too high, even when the slide bridge 5 is close to the upper edge of cylinder 2.

Figure 3:
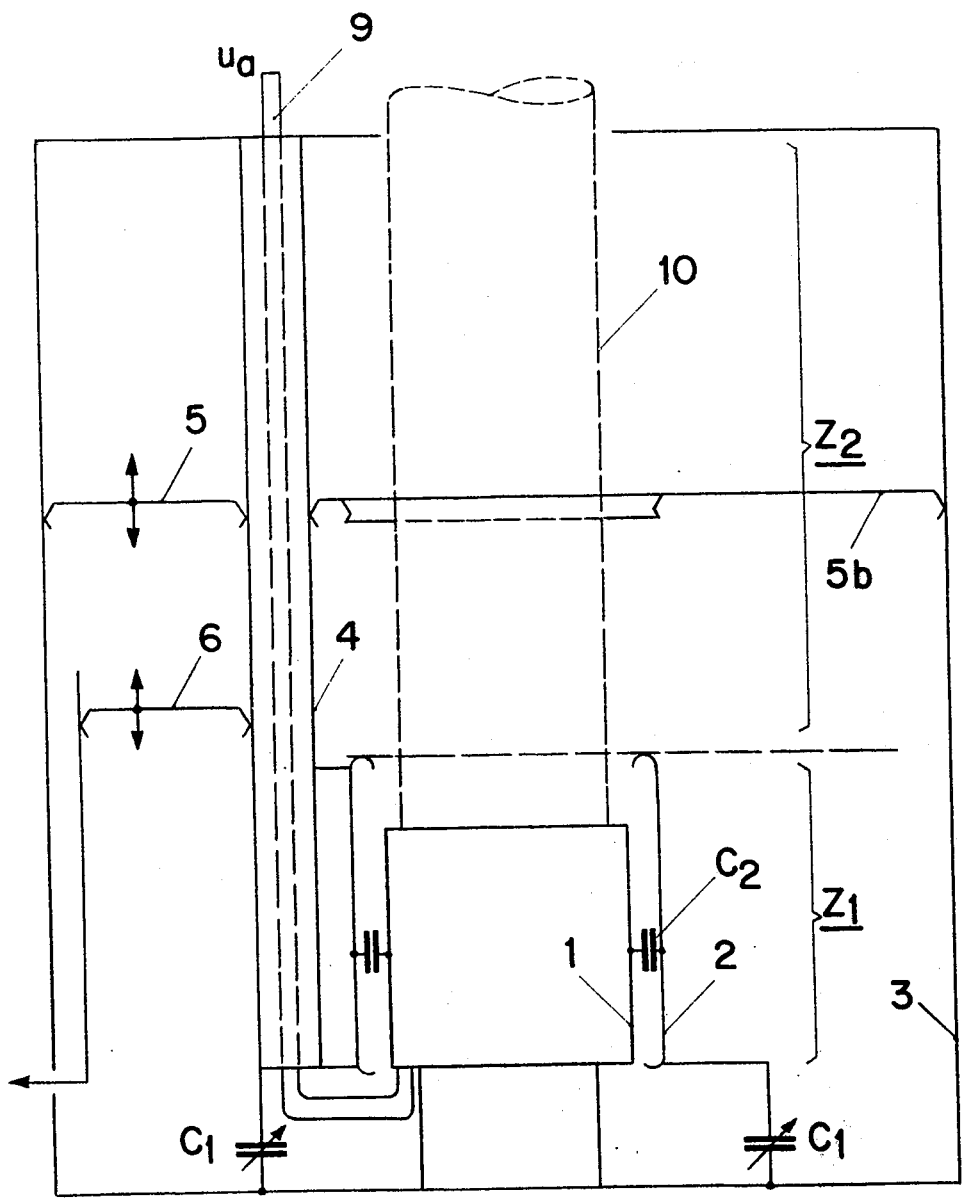
FIG. 3 shows a schematic sectional drawing of the example as described in accordance with the present invention.

In the configuration of the invention, as shown in FIG. 3, the transmitting tube 1 is surrounded by an asymmetrical can arrangement. Those elements which correspond to the configuration of FIG. 2 are identified by the same symbols. A principal difference compared with the configuration of FIG. 2 is that the cylinder 2 is open above the transmitting tube 1, and so the tube can be lifted out after the vapor duct 10, if there is one, has been removed. The remainder of the anode circuit assembly does not need to be removed, in contrast to the customary arrangement shown in FIG. 2. A further difference between the configuration of the invention as shown in FIG. 3 and the known arrangement depicted in FIG. 2 is that the second cylindrical conductor 4 is situated parallel to the can axis on one side of the anode circuit, outside the space required to insert and withdraw the transmitting tube 1. Two slide bridges 5 and 6 are provided for tuning the apparatus, the upper slide 5 having an opening for the symmetrical can 2 and a second, smaller opening for the asymmetrical conductor 4.

With the aid of high-frequency contacts, the shorting slide 5 maintains permanent contact between the asymmetrical conductor 4 and the housing 3; at the bottom it connects the symmetrical conductor 2 to the housing 3, again with high-frequency contacts. For the lower frequencies of the VHF range, the actual anode inductance $L_1$ is formed by the asymmetrical conductor 4, which is connected to the housing 3 via slide 5. For the higher frequencies, the anode inductance is formed by the coaxial assembly 2, 3, which is terminated by slide 5. It is thus possible to tune the anode circuit from the maximum value of the inductance, when the slide 4 is right at the top, to a minimum value of the inductance when slide 5 is close to the lower edge of conductor 2.

It is also possible, as an alternative of the arrangement shown in FIG. 3, to fix the coupling arm in a specified position. The anode circuit can then be matched to the subsequent load via a matching element located outside the anode circuit. Of particular advantage is that the voltage supply line to the anode 9 is located inside the second cylindrical conductor 4, the line being connected to the anode terminal of the transmitting tube 1 at the bottom by means of a transverse link. The anode supply line can at the same time be arranged so as to feed water to the anode.

Since the asymmetrical conductor and the anode supply line contained within it are virtually at the same high-frequency potential, the high-frequency current and high-frequency voltage in this cable are small. It is therefore sufficient if only a relatively small filter inductance is connected at the supply point.

The configuration described also has the important advantage that in the case of a vapor-cooled anode, the vapor can be drawn off immediately above the tube. The tube can be replaced easily from above, after removing the exhaust duct and a side panel from the housing wall. Because of the can-type circuit arrangement, the current loading on the high-frequency sliding contacts is much more uniform than with a configuration having separate coils. The arrangement described is less susceptible to faults than known devices of this kind. In addition, it allows the anode circuit to be tested and matched much more easily.

The height of the stage can be further reduced if only a part of the high-frequency contacts 5b are in contact with the housing 3 when the slide 5 is in the topmost position.

While the foregoing specification and drawings represent the preferred embodiments of the present invention, it will be obvious to those skilled in the art that various changes and modifications may be made therein without departing from the true spirit and scope of the present invention.

What is claimed is:

1. An anode arrangement for the final stage of a short-wave transmitter of the can type comprising:
   a transmitting tube having a central axis;
   a housing having a wall surrounding and coaxial with said transmitting tube axis;
   a first conductor within said housing surrounding and coaxial with said transmitting tube axis;
   a second conductor being arranged adjacent to said first conductor within the housing parallel to the transmitting tube axis;
   a first slide having portions extending between and connecting the second conductor and the housing wall, and being positionable between and connectable to the first conductor and the housing wall;
   an output collector, arranged within the housing parallel to said second conductor; and
   a second slide being connected between the second conductor and said output collector, said second slide for providing an output connection for said anode arrangement.

2. An anode arrangement as claimed in claim 1, including an anode voltage supply line which is disposed within said second conductor.

3. An anode arrangement as claimed in claim 1 including a vapor exhaust duct disposed over said transmitting tube, said housing including a central opening coaxial with said tube axis and said first slide including a middle opening for passage of said duct.

4. An anode arrangement as claimed in claim 2 wherein said anode supply line includes means for supplying water to the anode.

5. An anode arrangement as claimed in claim 1 wherein said second slide is fixed in a predetermined position.

6. An anode arrangement as claimed in claim 1 wherein said housing and said first and second conductors are cylinders and said first conductor includes an opening above said tube.

7. An asymmetrical anode arrangement for the final stage of a short-wave transmitter of the can type comprising:
   a transmitting tube having a central axis;
   a cylindrical housing surrounding and coaxial with said transmitting tube axis;

a first cylindrical conductor disposed within said housing and coaxial with said tube axis, said housing and conductor forming a characteristic impedance $Z_1$, therebetween;

a second cylindrical conductor disposed within said housing having a small diameter relative to the diameter of said first cylindrical conductor, said second cylindrical conductor being parallel to the first cylindrical conductor and outside thereof, said housing and conductor forming a characteristic impedance $Z_2$ therebetween;

a first slide disposed within said housing and having an opening for said first cylindrical conductor and an opening for said second cylindrical conductor for connecting said housing wall to said second conductor over part of its travel and connecting said housing wall to said first and second conductor over another part of its travel;

an output collector arranged within said housing parallel to said second conductor; and a second slide being connected between said second conductor and said output collector, said second slide for providing an output connection for said anode arrangement.

8. The anode arrangement as claimed in claim 7 wherein said first cylindrical conductor is an open cylinder, said opening being above said tube.

9. An anode arrangement as claimed in claim 7 including an anode voltage supply line which is disposed within said second conductor.

10. An anode arrangement as claimed in claim 8 including a vapor exhaust duct disposed over said transmitting tube, said housing including a central opening coaxial with said tube axis, said duct passing through the opening in said first conductor and said opening for said first conductor in said first slide.

* * * * *